United States Patent
Kamazuka et al.

(10) Patent No.: US 12,224,772 B2
(45) Date of Patent: Feb. 11, 2025

(54) COMPRESSION/DECOMPRESSION APPARATUS, STORAGE SYSTEM, AND COMPRESSION/DECOMPRESSION METHOD

(71) Applicant: Hitachi, Ltd., Tokyo (JP)

(72) Inventors: Tomoyuki Kamazuka, Tokyo (JP); Kenshiro Himoto, Tokyo (JP); Shoji Kato, Tokyo (JP); Yuusaku Kiyota, Tokyo (JP)

(73) Assignee: HITACHI VANTARA, LTD., Yokohama (JP)

( * ) Notice: Subject to any disclaimer, the term of this patent is extended or adjusted under 35 U.S.C. 154(b) by 105 days.

(21) Appl. No.: 18/125,188

(22) Filed: Mar. 23, 2023

(65) Prior Publication Data

US 2024/0088919 A1     Mar. 14, 2024

(30) Foreign Application Priority Data

Sep. 13, 2022    (JP) ................................. 2022-145303

(51) Int. Cl.
     *H03M 13/00*        (2006.01)
     *H03M 7/30*         (2006.01)

(52) U.S. Cl.
     CPC ..... *H03M 13/6312* (2013.01); *H03M 7/6041* (2013.01)

(58) Field of Classification Search
     CPC .................. H03M 13/6312; H03M 7/6041
     See application file for complete search history.

(56) References Cited

U.S. PATENT DOCUMENTS 5,465,338 A * 11/1995 Clay .................... G06F 3/0601
                                                 710/316
5,608,396 A * 3/1997 Cheng ................. H03M 7/3086
                                                   341/59

(Continued)

FOREIGN PATENT DOCUMENTS

JP        08-55063 A     2/1996
JP        8-116274 W     5/1996

(Continued)

OTHER PUBLICATIONS

Japanese Office Action received in corresponding Japanese Application No. 2022-145303 dated Jan. 23, 2024.

*Primary Examiner* — Joseph D Torres
(74) *Attorney, Agent, or Firm* — MATTINGLY & MALUR, PC

(57) ABSTRACT

In a compression mode in which plaintext data is input, and compressed, a first code that is an error detection code is generated with respect to the plaintext data, and compressed. A circuit generates restored plaintext data in which the compressed data is decompressed, for confirming successfulness. A second code that is an error detection code is generated with respect to the restored plaintext data and is compared with the first code. In a case where the first code and the second code agree, the compressed data and the first or second code are output. In a decompression mode, plaintext data is generated in which the input compressed data is decompressed. A third code that is an error detection code is generated with respect to the plaintext data and is compared with an input code, and when the input code and the third code agree, the plaintext data is output.

5 Claims, 13 Drawing Sheets

(56) References Cited

U.S. PATENT DOCUMENTS

| | | | | |
|---|---|---|---|---|
| 6,026,508 | A | * | 2/2000 | Craft ................. G11B 20/1833 714/766 |
| 6,661,839 | B1 | | 12/2003 | Ishida et al. |
| 7,477,741 | B1 | * | 1/2009 | Oakley ................. G06F 21/602 382/233 |
| 2022/0131555 | A1 | | 4/2022 | Hirao et al. |

FOREIGN PATENT DOCUMENTS

| | | |
|---|---|---|
| JP | 2022-070104 A | 5/2022 |
| WO | 98/43359 A1 | 10/1998 |

* cited by examiner

*101*

Command contents

| Transfer type | Compression/decompression |
|---|---|
| Transfer length | 8-block increments |
| Input data address | XXXXXX |
| Output destination address | YYYYYY |

FIG. 7

Distribution destination management table ~ 102

| Compression/decompression control unit # | Whether currently operable |
|---|---|
| 1 | YES |
| 2 | YES |
| 3 | NO |
| 4 | NO |
| 5 | YES |
| 6 | NO |
| 7 | YES |
| 8 | YES |

Aggregation unit request management table

| Compression/decompression control unit # | Whether requesting output |
|---|---|
| 1 | YES |
| 2 | YES |
| 3 | NO |
| 4 | NO |
| 5 | YES |
| 6 | NO |
| 7 | YES |
| 8 | YES |

FIG. 11

COMPRESSION/DECOMPRESSION APPARATUS, STORAGE SYSTEM, AND COMPRESSION/DECOMPRESSION METHOD

CROSS-REFERENCE TO RELATED APPLICATIONS

This application is based upon and claims the benefit of priority from Japanese Patent Application No. 2022-145303 filed in Japan Patent Office on Sep. 13, 2022, the contents of which are hereby incorporated by reference.

BACKGROUND

The present disclosure relates to a codec used in a storage system.

A codec may be implemented in a storage system, in order to increase speed of compression and decompression of data. A requirement for codecs is to ensure that compression processing is performed correctly.

Japanese Patent Application Publication No. H08-055063 discloses a flash disk with a compression function. The flash disk according to Japanese Patent Application Publication No. H08-055063 ensures that compression processing is performed correctly. The flash disk adds redundant data to write data from a host computer and performs compression thereof, and then performs decompression thereof and compares with the original data, thereby ensuring that compression processing is performed correctly. Further, the flash disk adds redundant data to the compressed data and writes to flash memory, and reads and compares this with data prior to writing, thereby ensuring that writing to the flash memory is performed correctly.

SUMMARY

The circuit scale of the flash disk according to Japanese Patent Application Publication No. H08-055063 is large, due to being equipped with a decompression circuit for ensuring that the compression processing is correctly performed.

It is an object of the present disclosure to provide technology enabling a codec having a configuration with good efficiency.

A codec according to an aspect of the present disclosure is a compression/decompression apparatus configured to perform compression of plaintext data and decompression of compressed data that includes: an error detection code generating unit configured to generate error detection code with respect to plaintext data; a compression circuit configured to compress plaintext data; a decompression circuit configured to decompress compressed data; and a comparing unit configured to generate error detection code with respect to plaintext data and compare this error detection code with other error detection code. In a compression mode of the codec in which input plaintext data is taken as input, and the input plaintext data is to be compressed, the error detection code generating unit generates a first code that is an error detection code with respect to the input plaintext data, the compression circuit generates compressed data in which the input plaintext data is compressed, the decompression circuit generates restored plaintext data in which the compressed data is decompressed, for confirming successfulness, the comparing unit generates a second code that is an error detection code with respect to the restored plaintext data and compares the second code with the first code, and in a case in which the first code and the second code agree, outputs the compressed data and the first code or the second code. Also, in a decompression mode of the codec in which input compressed data, and input code that is an error detection code with respect to original plaintext data of the input compressed data, are taken as input, and the input compressed data is decompressed, the decompression circuit used for confirming successfulness in the compression mode is used for decompression of the input compressed data, the decompression circuit generates plaintext data in which the input compressed data is decompressed, the comparing unit generates a third code that is an error detection code with respect to the plaintext data and compares the third code with the input code, and in a case in which the input code and the third code agree, outputs the plaintext data.

Providing a framework for judging whether or not the decompression circuit, used for confirmation of successfulness in the compression mode, is available for use at the time of decompressing, and enabling selection between a decompression circuit (not a circuit for confirmation of successfulness but a decompressing-only circuit) and the decompression circuit for confirmation of successfulness enables the overall circuit scale to be suppressed.

According to an aspect of the present disclosure, a circuit can be implemented with good efficiency in a codec that performs compression and decompression.

BRIEF DESCRIPTION OF THE DRAWINGS

FIG. 7 is a table showing command contents;
FIG. 10 is a diagram showing an example of a distribution destination management table;
FIG. 11 is a diagram showing an example of an aggregation unit request management table.

DETAILED DESCRIPTION OF THE EMBODIMENT

An embodiment of the present invention will be described below with reference to the Figures.

Figure 1:
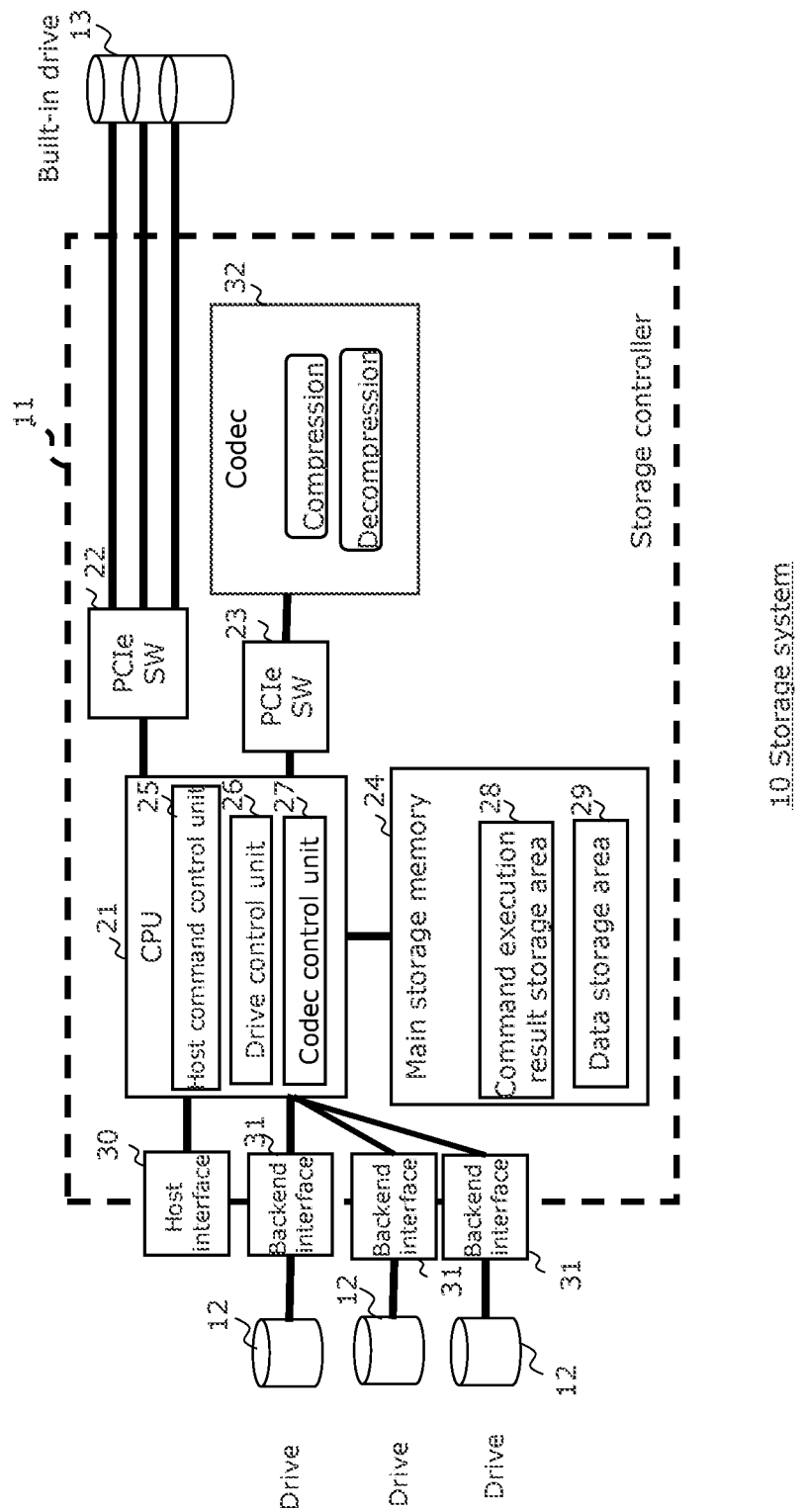
FIG. 1 is a block diagram of a storage system.

FIG. 1 is a block diagram of a storage system. The storage system 10 is a computer system that is composed including a server and an external storage apparatus, and that controls safekeeping and usage of data, as an example. The storage system 10 includes a storage controller 11, drives 12, and a built-in drive 13. The storage controller 11 is composed of the server as an example, and controls safekeeping of data in the external storage apparatus, retrieval of data from the external storage apparatus, and so forth. The built-in drive 13 is an external storage apparatus disposed within the server, and is, for example, an HDD (Hard Disk Drive), an SSD (Solid State Drive), flash memory, or the like. The drives 12 are external storage apparatuses coupled to the server, and are, for example, HDDs, SSDs, flash memory, or the like. A drive 12 is provided corresponding to each of various types of protocols.

The storage controller 11 has a CPU 21, a PCIe SW 22, a PCIe SW 23, main storage memory 24, a host interface 30, backend interfaces 31, and a codec 32. The CPU (Central Processing Unit) 21 is a processing apparatus that realizes various types of functions of the storage controller 11 by executing processing of software programs using the main storage memory 24. The PCIe SW 22 is an apparatus that performs switching of communication by PCIe (Peripheral Component Interconnect Express), and realizes high-speed communication between the CPU 21 and the built-in drive 13. The PCIe SW 23 is an apparatus that performs switching of communication by PCIe, and realizes high-speed communication between the CPU 21 and the codec 32. The host interface 30 is an interface unit that relays exchange of data with a host computer (hereinafter also referred to as "host") that is omitted from illustration, which a user uses. The backend interfaces 31 are interface units that relay exchange of data with the drives 12. The codec 32 is an apparatus that, in a case of storing compressed data in the drives 12 or the built-in drive 13, performs compression and decompression of that data.

A host command control unit 25, a drive control unit 26, and a codec control unit 27 are realized by the CPU 21 executing software programs. A command execution result storage area 28 and a data storage area 29 are configured in the main storage memory 24. The host command control unit 25 process commands from the host. The drive control unit 26 gives commands to each of the drives 12 and controls the drives 12. The codec control unit 27 gives commands to the codec 32 and controls the codec 32. The command execution result storage area 28 is an area that stores details of commands given to the codec 32, and reports regarding the results of executing the commands. The data storage area 29 is an area that stores data before compression and after compression by the codec 32.

Figure 2:
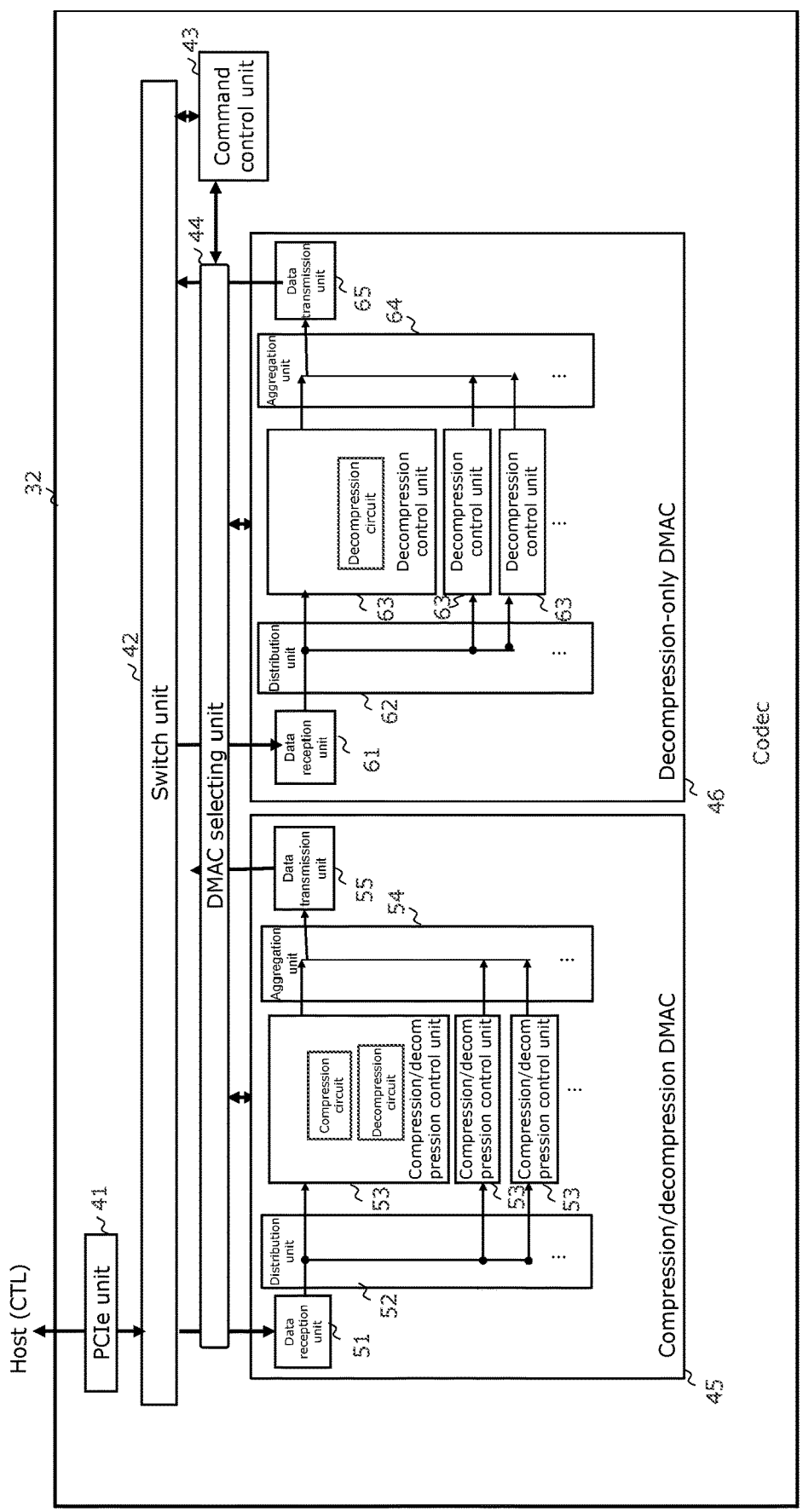
FIG. 2 is a schematic block diagram of a codec.

FIG. 2 is a block diagram of an overview of the codec.

The codec 32 has a PCIe unit 41, a switch unit 42, a command control unit 43, a DMAC selecting unit 44, a compression/decompression DMAC 45, and a decompression-only DMAC 46. "DMAC" is an abbreviation of Direct Memory Access Controller. The codec 32 is coupled to the PCIe SW 23, as illustrated in FIG. 1, and performs communication with the host via the PCIe SW 23, the CPU 21, and the host interface 30.

The PCIe unit 41 exchanges data and commands with the PCIe SW 23. The switch unit 42 performs distribution and aggregation of data exchanged between the codec 32 and the CPU 21. The command control unit 43, under notification to the effect that a command has been issued from the CPU 21, reads contents of the command (hereinafter also referred to as "command contents") from the command execution result storage area 28 of the main storage memory 24, and transmits the command contents to the DMAC selecting unit 44. The DMAC selecting unit 44 interprets the command contents of the command notified from the command control unit 43, and transmits the command to a DMAC that is appropriately selected by DMAC selection processing. DMAC selection processing will be described later.

DMACs are entities that execute commands involving compression and decompression of data, and there are the compression/decompression DMAC 45 and the decompression-only DMAC 46. There are many parts in common between the compression/decompression DMAC 45 and the decompression-only DMAC 46. For example, a circuit that can be used for both the compression/decompression DMAC 45 and the decompression-only DMAC 46 may be configured by an FPGA (Field Programmable Gate Array), with dummification being performed for part of the circuit in a case of using as the decompression-only DMAC 46. The compression/decompression DMAC 45 and the decompression-only DMAC 46 can be efficiently configured by a common circuit. Also, the compression/decompression DMAC 45 and the decompression-only DMAC 46 including a common circuit can be easily configured by a programmable logic circuit part. Also, the number and ratio of compression circuits and decompression circuits can be easily changed by rewriting the programmable logic circuit part.

The compression/decompression DMAC 45 is capable of performing both compression and decompression. Which of a compression mode and a decompression mode to operate under depends on instructions from the DMAC selecting unit 44. The compression/decompression DMAC 45 has a data reception unit 51, a distribution unit 52, a plurality of compression/decompression control units 53, an aggregation unit 54, and a data transmission unit 55. Operations of the data reception unit 51, the distribution unit 52, the plurality of compression/decompression control units 53, the aggregation unit 54, and the data transmission unit 55 will be described later. The decompression-only DMAC 46 is a DMAC that is only capable of decompression. The decompression-only DMAC 46 has a data reception unit 61, a distribution unit 62, a plurality of decompression control units 63, an aggregation unit 64, and a data transmission unit 65. The operations of the data reception unit 61, the distribution unit 62, the plurality of decompression control units 63, the aggregation unit 64, and the data transmission unit 65 will be described later.

Figure 3:
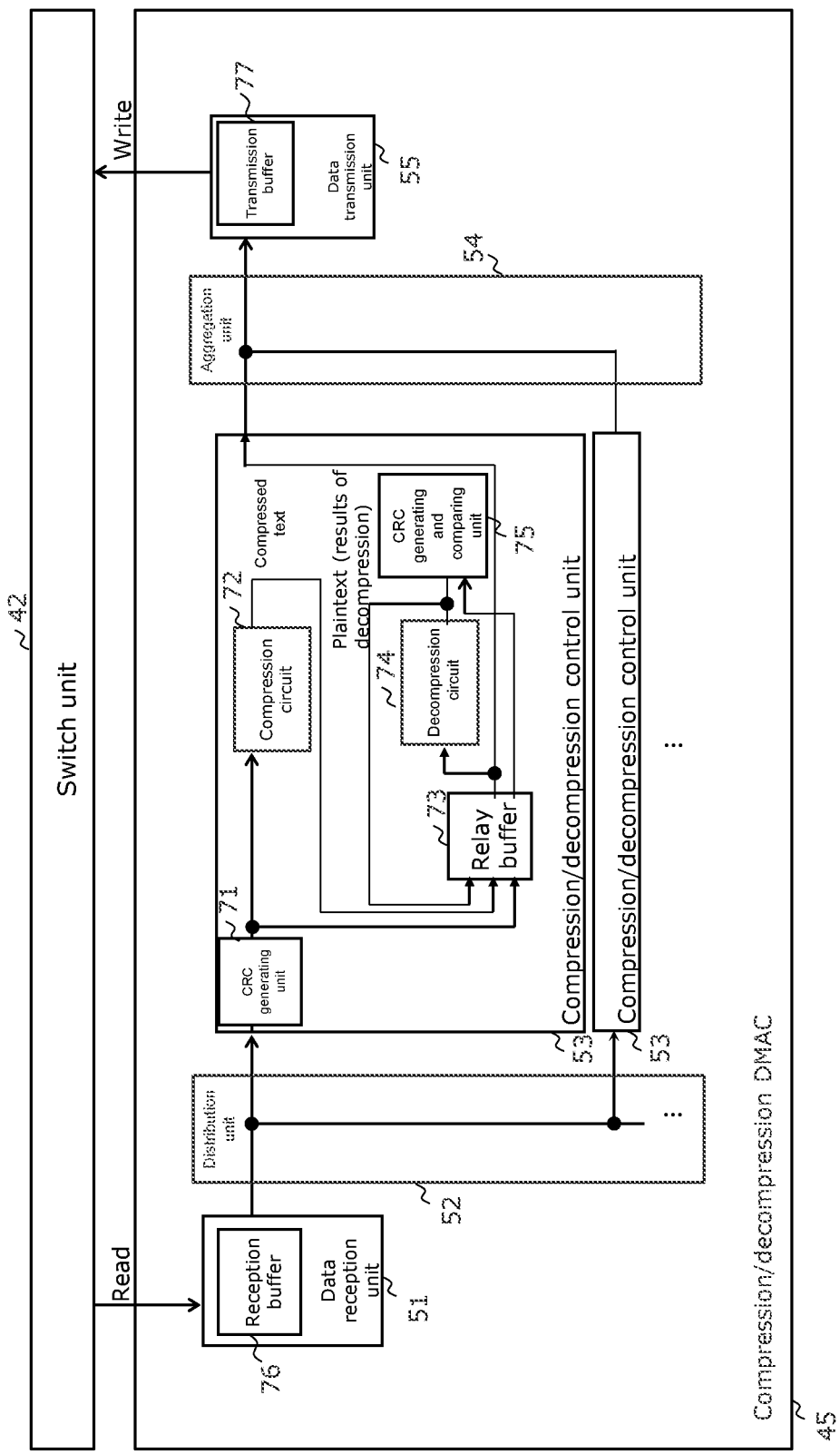
FIG. 3 is a block diagram of a DMAC for compression/decompression.

FIG. 3 is a block diagram of a compression/decompression DMAC.

The compression/decompression DMAC 45 has the data reception unit 51, the distribution unit 52, the plurality of compression/decompression control units 53, the aggregation unit 54, and the data transmission unit 55, as described above. Each of the compression/decompression control units 53 has a CRC (Cyclic Redundancy Check) generating unit 71, a compression circuit 72, a relay buffer 73, a decompression circuit 74, and a CRC generating and comparing unit 75. Also, the data reception unit 51 has a reception buffer 76, and the data transmission unit 55 has a transmission buffer 77.

The data reception unit 51 receives data read from the data storage area 29 of the main storage memory 24, which is temporarily stored in the reception buffer 76.

The distribution unit 52 manages states of each of the compression/decompression control units 53, decides a compression/decompression control unit 53 that is to be a distribution destination for the data recorded in the reception buffer 76 of the data reception unit 51, and allocates the data to the compression/decompression control unit 53 that is the distribution destination.

The compression/decompression control unit 53 has a compression mode for compressing data given thereto by the distribution unit 52, and a decompression mode for decompressing data given thereto by the distribution unit 52.

In the compression mode, uncompressed data is given to the compression/decompression control unit 53 by the distribution unit 52. Uncompressed data will also be referred to as "plaintext data" hereinafter. At the compression/decompression control unit 53, the CRC generating unit 71 calculates CRC code of the plaintext data, and stores this in the relay buffer 73. Also, the compression circuit 72 compresses the data, and stores the data after compression (hereinafter also referred to as "compressed text data") in the relay buffer 73.

The decompression circuit 74 then retrieves the compressed text data from the relay buffer 73 and performs decompression thereof. The CRC generating and comparing unit 75 calculates the CRC code of the plaintext data that has undergone compression by the compression circuit 72 and decompression by the decompression circuit 74, and compares the CRC code thereof with the CRC code calculated from the original plaintext data that is stored in the relay buffer 73. If these two CRC codes agree, this ensures that compression has been successfully performed by the compression circuit 72, and that correct CRC code has been calculated by the CRC generating unit 71. Accordingly, the compression/decompression control unit 53 outputs the compressed text data and the CRC code stored in the relay buffer 73 to the aggregation unit 54.

Figure 4:
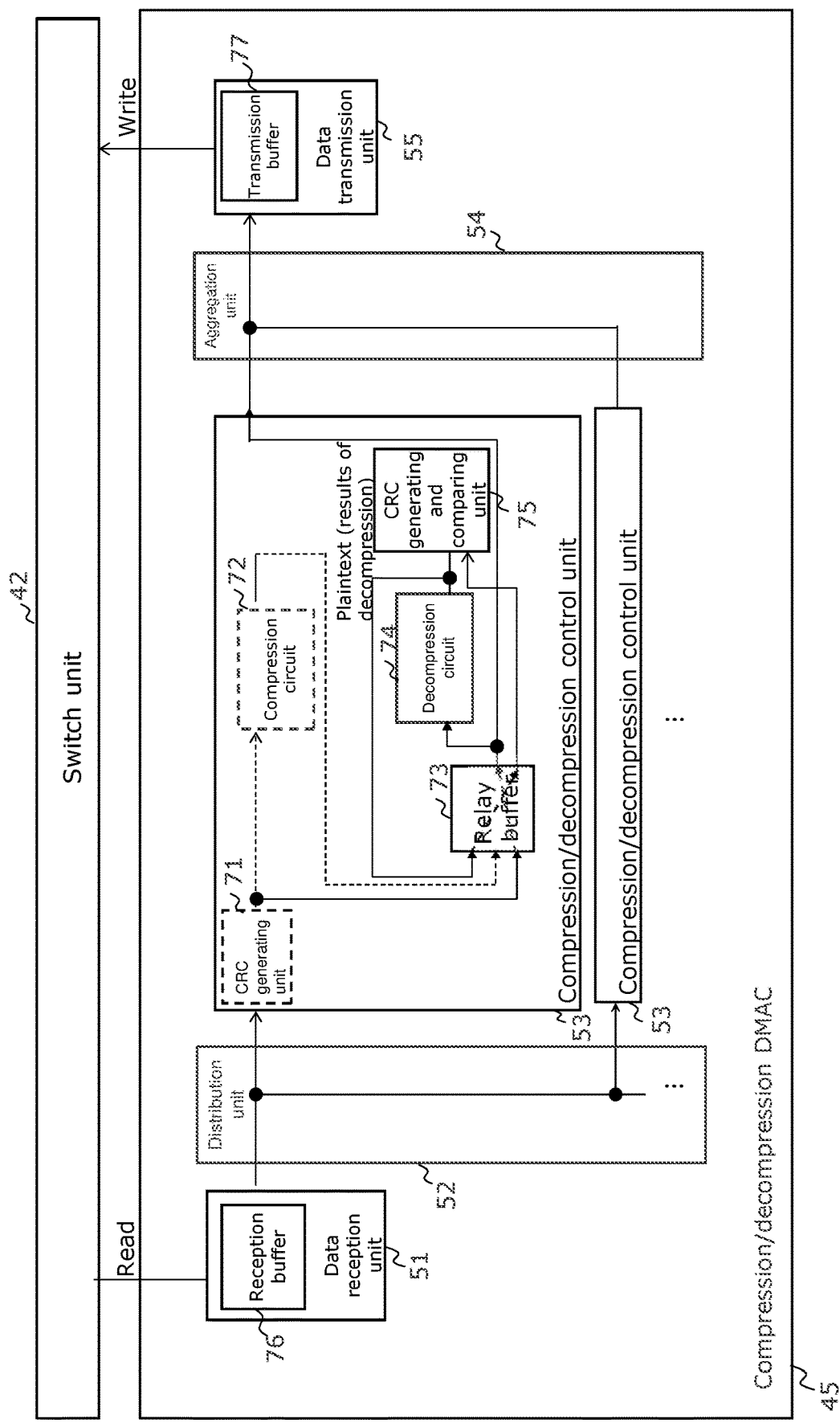
FIG. 4 is a diagram for describing operations of a compression/decompression control unit in decompression mode.

FIG. 4 is a diagram for describing operations of the compression/decompression control unit in decompression mode. As illustrated in FIG. 4, the CRC generating unit 71 and the compression circuit 72 in the compression/decompression control unit 53 are not used in the decompression mode.

In the decompression mode, compressed text data and the CRC code corresponding to the original plaintext data of that compressed text data are given to the compression/decompression control unit 53 by the distribution unit 52. The compressed text data and the CRC code which are given thereto are stored in the relay buffer 73 at the compression/decompression control unit 53, and the decompression circuit 74 retrieves the compressed text data from the relay buffer 73 and performs decompression thereof to generate plaintext data. The plaintext data that is generated is stored in the relay buffer 73, and is also given to the CRC generating and comparing unit 75. The CRC generating and comparing unit 75 calculates the CRC code of the plaintext data generated by the decompression circuit 74, and performs comparison thereof with the CRC code stored in the relay buffer 73. If these two CRC codes agree, this ensures that decompression has been successfully performed by the decompression circuit 74. Accordingly, the compression/decompression control unit 53 outputs the plaintext data stored in the relay buffer 73 to the aggregation unit 54.

Returning to FIG. 3, the aggregation unit 54 performs arbitration of data from the plurality of compression/decompression control units 53, and exclusively outputs the data to the transmission buffer 77 of the data transmission unit 55, one at a time. The data transmission unit 55 sends the data stored in the transmission buffer 77 to the CPU 21 via the switch unit 42 and the PCIe unit 41, and the CPU 21 stores this data in the data storage area 29 of the main storage memory 24.

As described above, in a compression/decompression apparatus that performs compression and decompression of data, a decompression circuit used for verification of data compression is also used for data decompression, and accordingly a codec with an efficient configuration can be realized.

Also, managing the plurality of compression/decompression control units 53 by the distribution unit 52 and the aggregation unit 54 enables the resources of the compression circuits and the decompression circuits to be efficiently used.

Figure 5:
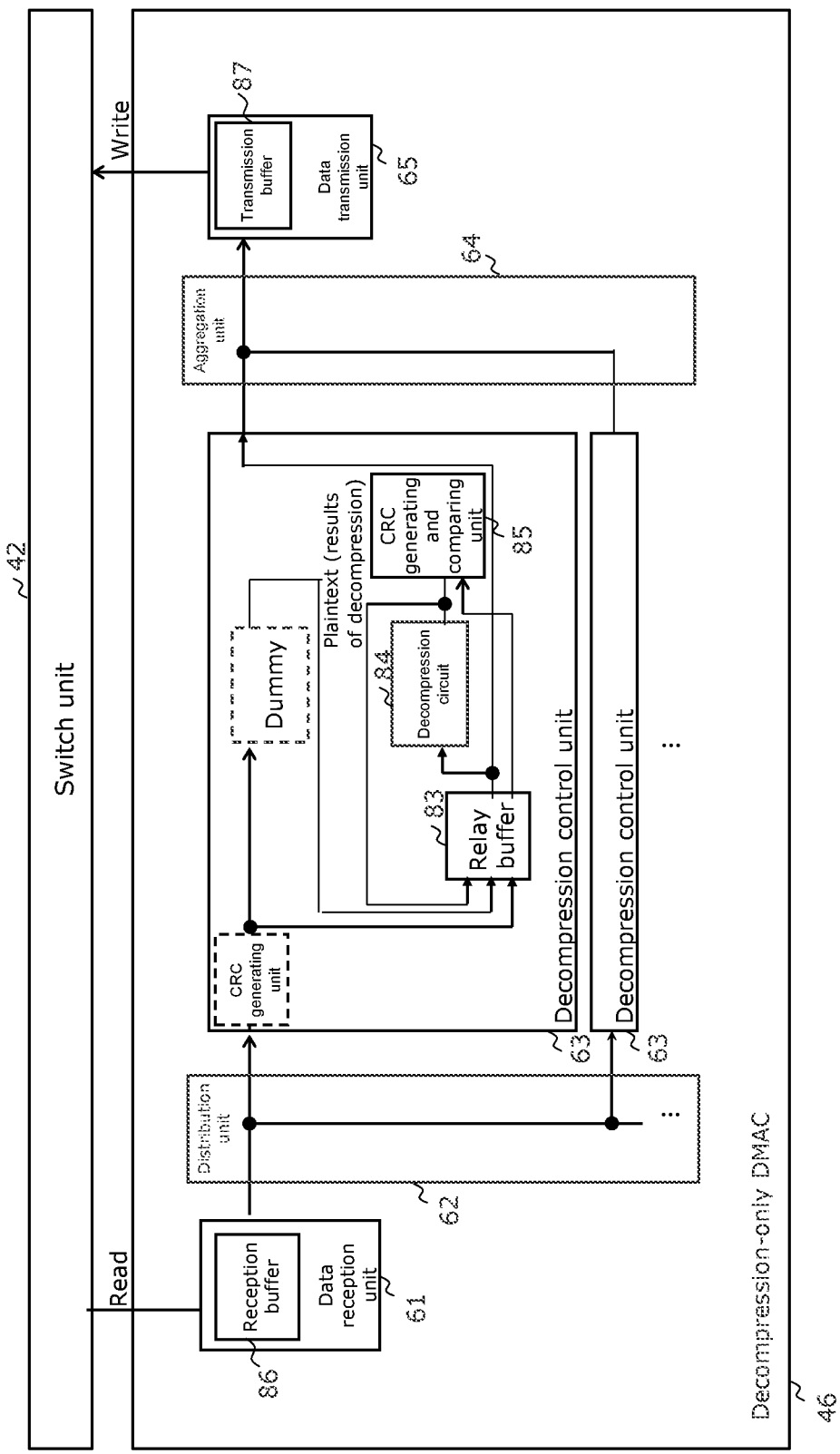
FIG. 5 is a block diagram of a decompression-only DMA controller.

FIG. 5 is a block diagram of the decompression-only DMA controller.

As described above, the decompression-only DMAC 46 has the data reception unit 61, the distribution unit 62, the plurality of decompression control units 63, the aggregation unit 64, and the data transmission unit 65. Each decompression control unit 63 has a relay buffer 83, a decompression circuit 84, and a CRC generating and comparing unit 85. Also, the data reception unit 61 has a reception buffer 86, and the data transmission unit 65 has a transmission buffer 87. As described above, the decompression-only DMAC 46 has many portions in common with the compression/decompression DMAC 45.

The data reception unit 61 corresponds to the data reception unit 51 of the compression/decompression DMAC 45. The distribution unit 62 corresponds to the distribution unit 52 of the compression/decompression DMAC 45. The aggregation unit 64 corresponds to the aggregation unit 54 of the compression/decompression DMAC 45. The data transmission unit 65 corresponds to the data transmission unit 55 of the compression/decompression DMAC 45. The reception buffer 86 corresponds to the reception buffer 76 of the compression/decompression DMAC 45. The transmission buffer 87 corresponds to the transmission buffer 77 of the compression/decompression DMAC 45.

Also, the decompression control unit 63 is configured by dummification of part of the compression/decompression control unit 53 of the compression/decompression DMAC 45. The relay buffer 83, the decompression circuit 84, and the CRC generating and comparing unit 85 of the decompression control unit 63 respectively correspond to the relay buffer 73, the decompression circuit 74, and the CRC generating and comparing unit 75 of the compression/decompression control unit 53.

Portions corresponding to the CRC generating unit 71 and the compression circuit 72 are dummified in the decompression control unit 63.

The operations of the decompression-only DMAC 46 are the same as the operations of the compression/decompression DMAC 45 in the decompression mode. Compressed text data and the CRC code corresponding to the original plaintext data of that compressed text data are given to the decompression control unit 63 by the distribution unit 62. The compressed text data and the CRC code which are given thereto are stored in the relay buffer 83 at the decompression control unit 63, and the decompression circuit 84 retrieves the compressed text data from the relay buffer 83 and performs decompression thereof to generate plaintext data. The plaintext data that is generated is stored in the relay buffer 83, and is also given to the CRC generating and comparing unit 85. The CRC generating and comparing unit 85 calculates the CRC code of the plaintext data generated by the decompression circuit 84, and performs comparison thereof with the CRC code stored in the relay buffer 83. If these two CRC codes agree, this ensures that decompression has been successfully performed by the decompression circuit 84. Accordingly, the decompression control unit 63 outputs the plaintext data stored in the relay buffer 83 to the aggregation unit 64.

Figure 6:
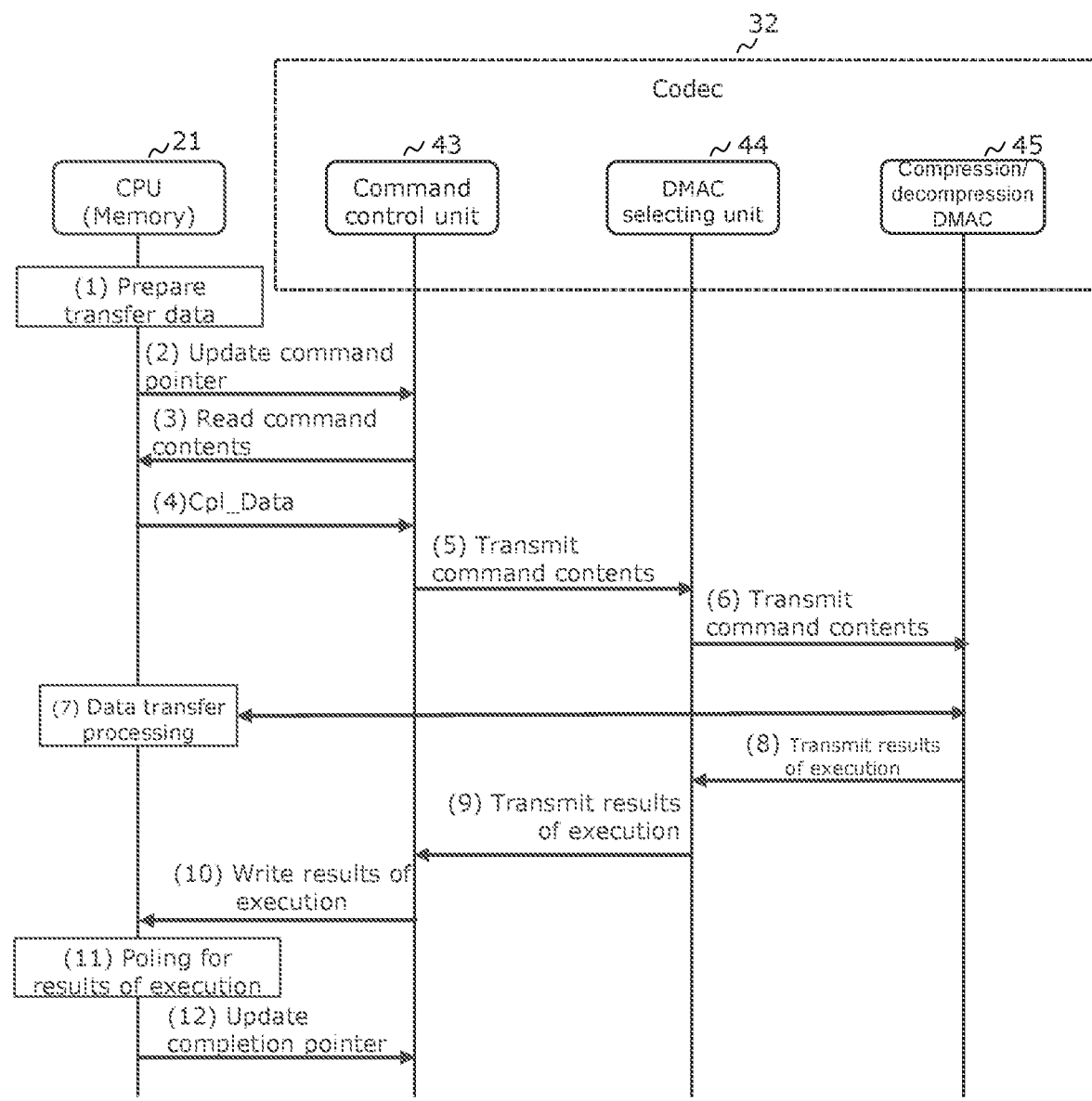
FIG. 6 is a sequence diagram showing operations of the codec in compression mode.

FIG. 6 is a sequence diagram showing operations of the codec in compression mode.

(1) First, the CPU 21 stores command contents for data compression in the command execution result storage area 28 of the main storage memory 24, and stores the data that is a compression target in the data storage area 29 of the main storage memory 24, on the basis of a request from the host computer.

FIG. 7 is a table showing command contents.

Referencing FIG. 7, listed in command contents 101 are "Transfer type", "Transfer length", "Input data address", and "Output destination address". "Transfer type" indicates whether the processing that the data to be transferred is to be subjected to is compression or decompression. This will be assumed to be compression here. "Transfer length" indicates the length of increments in which the data to be transferred is to be subjected to processing. This will be assumed to be 8-block increments here. The input data address indicates the address where the input data is stored. This will be assumed to be XXXXXX here. The output destination address is the address to which the output data, obtained by the processing that the input data is subjected to, should be output. This will be assumed to be YYYYYY here.

(2) Next, the CPU 21 updates the pointer for this command, and activates transfer of the command.

(3) Next, the command control unit 43 of the codec 32 issues an MRd command for reading the command contents from the main storage memory 24.

(4) Next, the command control unit 43 receives Cpl_Data (completion data) from the main storage memory 24, and acquires the command contents. The command contents shown in FIG. 7 are acquired at this point.

(5) Next, the command control unit 43 confirms that the DMAC selecting unit 44 is in a RDY state, and transmits the command contents that are acquired to the DMAC selecting unit 44.

(6) The DMAC selecting unit 44 receives the command contents, confirms the transfer type contained in the command contents, selects the DMAC to allocate the command to on the basis of the transfer type thereof, and transmits the command contents to the DMAC that is selected.

Figure 8:
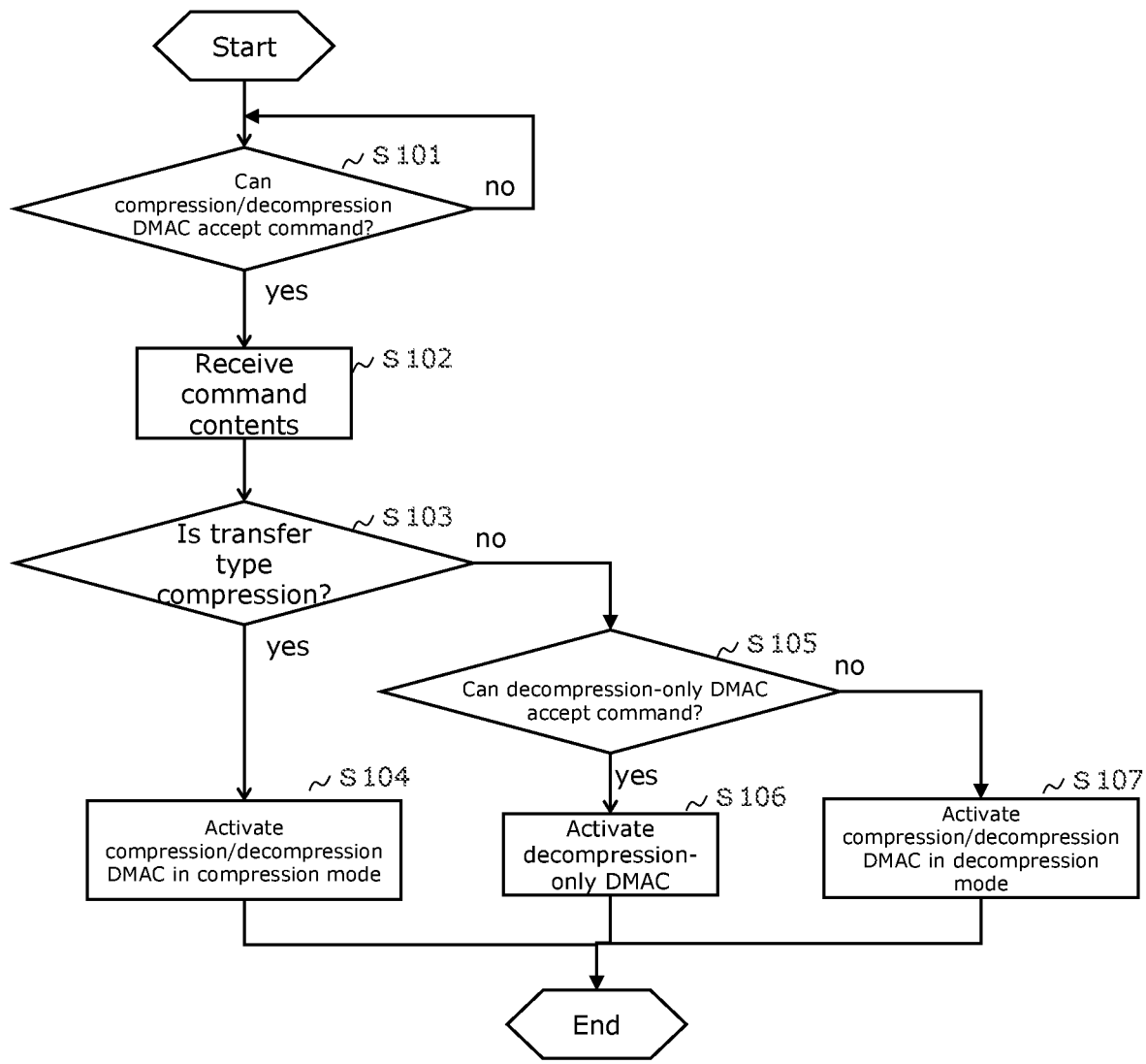
FIG. 8 is a flowchart of DMAC selection processing.

FIG. 8 is a flowchart of DMAC selection processing. DMAC selection processing is processing for the DMAC selecting unit 44 to select the DMAC to allocate the command to.

Referencing FIG. 8, in step S101, the DMAC selecting unit 44 determines whether or not the compression/decompression DMAC 45 can accept the command. If even one of the plurality of compression/decompression control units 53 implemented in the compression/decompression DMAC 45 is capable of accepting, the compression/decompression DMAC 45 as such is capable of accepting the command.

Upon receiving the command contents in step S102, in step S103 the DMAC selecting unit 44 determines whether the "Transfer type" included in the command contents is "Compression" or "Decompression". In a case in which the "Transfer type" is "Compression", in step S104 the DMAC selecting unit 44 selects the compression/decompression DMAC 45, and activates the compression/decompression DMAC 45 in compression mode.

Conversely, in a case in which the "Transfer type" is "Decompression", in step S105, the DMAC selecting unit 44 determines whether or not the decompression-only DMAC 46 is capable of accepting the command. If the decompression-only DMAC 46 is capable of accepting the command, in step S106 the DMAC selecting unit 44 selects and activates the decompression-only DMAC 46.

Conversely, in a case in which the decompression-only DMAC 46 is not capable of accepting the command, in step S107 the DMAC selecting unit 44 selects the compression/decompression DMAC 45 and activates the compression/decompression DMAC 45 in decompression mode.

Since the "Transfer type" is "Decompression" here, the DMAC selecting unit 44 selects the compression/decompression DMAC 45, and activates the compression/decompression DMAC 45 in compression mode.

As described above, in the DMAC selection processing, the decompression circuit of the compression/decompression control unit 53 is used when resources of the decompression control unit 63 are insufficient with respect to requests for data decompression, and accordingly the resources of decompression circuits can be effectively used.

Description will now return to FIG. 6.

(7) A DMAC selected by the DMAC selecting unit 44 performs data transfer processing in accordance with the command contents. The "Transfer type" is "Compression" here, the "Input data address" is "XXXXXX", and the compression/decompression DMAC 45 has been selected, and accordingly the DMAC selecting unit 44 transfers the data of address XXXXXX in the main storage memory 24 to the compression/decompression DMAC 45 for compression of the data.

(8) The compression/decompression DMAC 45 compresses the data transferred thereto, and transmits the results of executing data compression to the DMAC selecting unit 44. The results of execution include information to the effect that compression was performed successfully, and the compressed data obtained by the compression, for example.

(9) The DMAC selecting unit 44 transmits the results of execution received from the compression/decompression DMAC 45 to the command control unit 43.

(10) The command control unit 43 writes the results of execution received from the DMAC selecting unit 44 to the main storage memory 24.

(11) The CPU 21 performs polling of the area of the results of execution in the main storage memory 24, and acquires the results of execution written by the command control unit 43 of the codec 32. The results of execution include information to the effect that compression was performed successfully, and the compressed data obtained by the compression, for example.

(12) The CPU 21 updates the pointer, for example, thereby notifying the command control unit 43 of the codec 32 that the command is completed.

Figure 9:
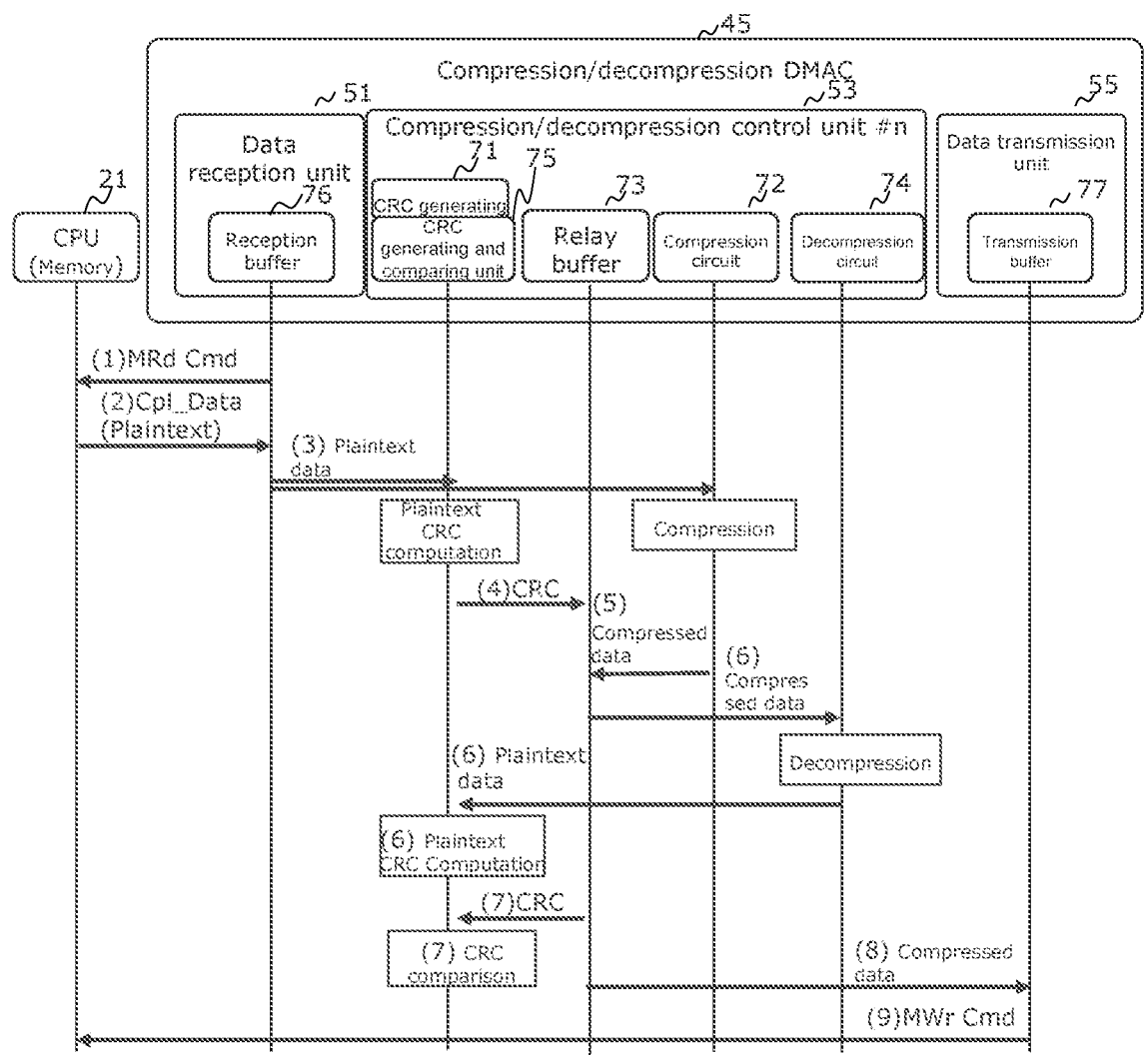
FIG. 9 is a sequence diagram showing operations of the compression/decompression DMAC in compression mode.

FIG. 9 is a sequence diagram showing operations of the compression/decompression DMAC in compression mode.

(1) to (2) The command control unit 43 issues an MRd command, receives Cpl_Data and acquires command contents, and writes the command contents to the reception buffer 76 of the data reception unit 51 of the compression/decompression DMAC 45 (see (3) to (6) in FIG. 6). Plaintext data that is the target for compression is included in the command contents written to the reception buffer 76.

(3) At the compression/decompression DMAC 45, the plaintext data written to the reception buffer 76 is transmitted by the distribution unit 52 to one of the plurality of compression/decompression control units 53. At this time, the distribution unit 52 manages the state of each of the compression/decompression control units 53, and selects the compression/decompression control unit 53 for transmission of the plaintext data on the basis of this state.

FIG. 10 is a diagram showing an example of a distribution destination management table. The distribution destination management table 102 is a table for the distribution unit 52 to manage the states of the compression/decompression control units 53. Configured in the distribution destination management table 102 are the states of the compression/decompression control units 53, regarding whether each is operable or inoperable.

Referencing FIG. 10, identification numbers (#) of the compression/decompression control units 53, and the state of each compression/decompression control unit 53, are recorded in the distribution destination management table 102 in a correlated manner. "YES" indicates an operable state, and "NO" indicates an inoperable state. Each compression/decompression control unit 53 is in an operable state if it is capable of accepting distribution of data. Also, each compression/decompression control unit 53 is in an inoperable state if executing compression and/or decompression operations with respect to data that is already distributed.

The distribution unit 52 references the distribution destination management table 102, selects a compression/decompression control unit 53 of which the state is "YES" as a distribution destination, and transmits the plaintext data. At the compression/decompression control unit 53 that is the distribution destination, the CRC generating unit 71 generates CRC code for the plaintext data, and the compression circuit 72 compresses the plaintext data and generates the compressed data.

(4) The CRC generating unit 71 stores the generated CRC code in the relay buffer 73.

(5) The compression circuit 72 stores the generated compressed data in the relay buffer 73.

(6) Subsequently, the decompression circuit 74 acquires and decompresses the compressed data stored in the relay buffer 73 to generate plaintext data, which is then transmitted to the CRC generating and comparing unit 75. The CRC generating and comparing unit 75 generates CRC code for the plaintext data received from the decompression circuit 74.

(7) Further, the CRC generating and comparing unit 75 acquires, from the relay buffer 73, the CRC code that the CRC generating unit 71 generated from the original plaintext data, and compares that CRC code and the CRC code that the CRC generating and comparing unit 75 itself generated from the plaintext data that has been received from the decompression circuit 74, and undergone compression and decompression.

(8) Upon the two CRC codes agreeing in the comparison at the CRC generating and comparing unit 75, the compressed data stored in the relay buffer 73 is transmitted to the data transmission unit 55 after undergoing arbitration by the aggregation unit 54.

The aggregation unit 54 manages whether or not there is a request for data transmission from the plurality of compression/decompression control units 53, selects the compression/decompression control units 53 regarding which there is a request, one at a time, and transmits the data to the data transmission unit 55.

FIG. 11 is a diagram showing an example of an aggregation unit request management table. The aggregation unit request management table 103 is a table for the aggregation unit 54 to manage whether or not there is a request for data transmission from the compression/decompression control units 53. Configured in the aggregation unit request management table 103 is whether or not each compression/decompression control unit 53 is in a state of performing requesting of data transmission.

Referencing FIG. 11, identification numbers (#) of the compression/decompression control units 53, and the state of each compression/decompression control unit 53 regarding whether requesting or not, are recorded in the aggregation unit request management table 103 in a correlated manner. "YES" indicates requesting, and "NO" indicates not requesting. Upon performing compression or decompression of data, and generating data to be transmitted, the compression/decompression control units 53 issue a request for data transmission. Upon the data regarding which a request has been made being stored in the transmission buffer 77 after undergoing arbitration by the aggregation unit 54, that request ends.

The aggregation unit 54 references the aggregation unit request management table 103, selects a compression/decompression control unit 53 of which the state is "YES", one at a time, and sequentially transmits the data to the data transmission unit 55. The compressed data is stored in the transmission buffer 77 at the data transmission unit 55.

(9) The data transmission unit 55 issues an MWr_Cmd, and writes the compressed data stored in the transmission buffer 77 to the main storage memory 24.

Figure 12:
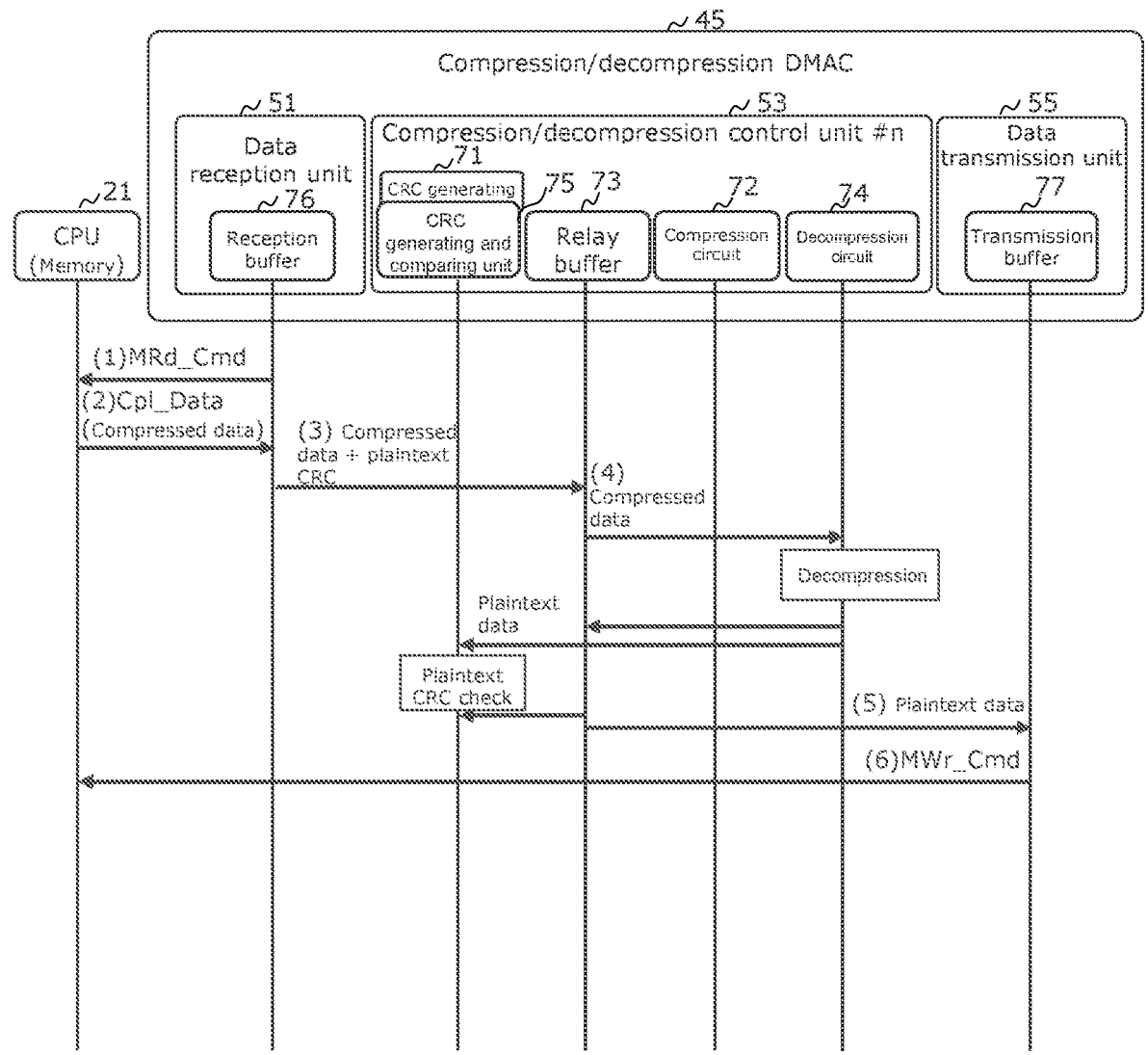
FIG. 12 is a sequence diagram shown internal operations of the compression/decompression DMAC in decompression mode.

FIG. 12 is a sequence diagram shown internal operations of the compression/decompression DMAC in decompression mode.

(1) to (2) The command control unit 43 issues an MRd command, receives Cpl_Data and acquires command contents, and the DMAC selecting unit 44 writes the command contents to the reception buffer 76 of the data reception unit 51 of the DMAC selected by DMAC selection processing (compression/decompression DMAC 45 here) (see (3) to (6) in FIG. 6). The command contents written to the reception buffer 76 include compressed data that is the target for decompressing, and a CRC code regarding the original plaintext data for that compressed data.

(3) At the compression/decompression DMAC 45, the compressed data written to the reception buffer 76 is transmitted by the distribution unit 52 to one of the plurality of compression/decompression control units 53. At this time, the distribution unit 52 manages the state of each of the compression/decompression control units 53, and selects the compression/decompression control unit 53 for transmission of the compressed data on the basis of this state. The compressed data is stored in the relay buffer 73 of the compression/decompression control unit 53.

(4) Next, the decompression circuit 74 acquires and decompresses the compressed data stored in the relay buffer 73 to generate plaintext data, which is transmitted to the CRC generating and comparing unit 75. The CRC generating and comparing unit 75 generates CRC code for the plaintext data received from the decompression circuit 74.

Further, the CRC generating and comparing unit 75 acquires, from the relay buffer 73, the CRC code received along with the original compressed data, and compares this CRC code with the CRC code that the CRC generating and comparing unit 75 itself generated from the plaintext data received from the decompression circuit 74.

(5) Upon the two CRC codes agreeing in the comparison at the CRC generating and comparing unit 75, the plaintext data stored in the relay buffer 73 is transmitted to the data transmission unit 55 after undergoing arbitration by the aggregation unit 54. The aggregation unit 54 manages whether or not there is a request for data transmission from the plurality of compression/decompression control units 53, selects the compression/decompression control units 53 regarding which there is a request, one at a time, and transmits the data to the data transmission unit 55. The plaintext data is stored in the transmission buffer 77 at the data transmission unit 55.

(6) The data transmission unit 55 issues an MWr_Cmd, and writes the plaintext data stored in the transmission buffer 77 to the main storage memory 24.

Figure 13:
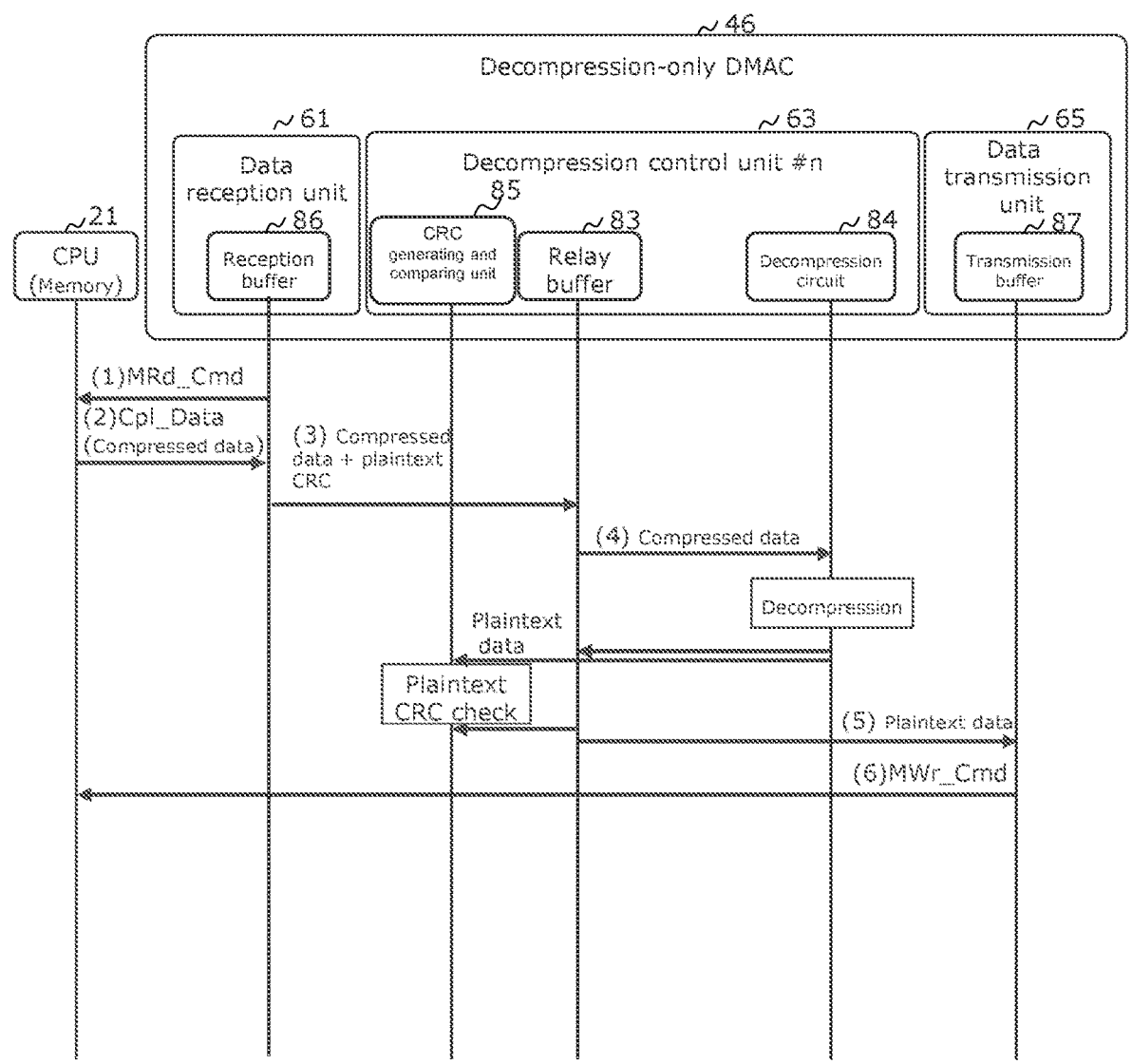
FIG. 13 is a sequence diagram showing internal operations of the decompression-only DMAC.

FIG. 13 is a sequence diagram showing internal operations of the decompression-only DMAC.

(1) to (2) The command control unit 43 issues an MRd command, receives Cpl_Data and acquires command contents, and the DMAC selecting unit 44 writes the command contents to the reception buffer 86 of the data reception unit 61 of the DMAC selected by DMAC selection processing (decompression-only DMAC 46 here). The command contents written to the reception buffer 86 include compressed data that is the target for decompressing, and a CRC code regarding the original plaintext data for that compressed data.

(3) At the decompression-only DMAC 46, the compressed data written to the reception buffer 86 is transmitted by the distribution unit 62 to one of the plurality of decompression control units 63. At this time, the distribution unit 62 manages the state of each of the decompression control units 63, and selects the decompression control unit 63 for transmission of the compressed data on the basis of this state. The compressed data is stored in the relay buffer 83 of the decompression control unit 63.

(4) Next, the decompression circuit 84 acquires and decompresses the compressed data stored in the relay buffer 83 to generate plaintext data, which is transmitted to the CRC generating and comparing unit 85. The CRC generating and comparing unit 85 generates CRC code for the plaintext data received from the decompression circuit 84.

Further, the CRC generating and comparing unit 85 acquires, from the relay buffer 83, the CRC code received along with the original compressed data, and compares this CRC code with the CRC code that the CRC generating and comparing unit 85 itself generated from the plaintext data received from the decompression circuit 84.

(5) Upon the two CRC codes agreeing in the comparison at the CRC generating and comparing unit 85, the plaintext data stored in the relay buffer 83 is transmitted to the data transmission unit 65 after undergoing arbitration by the aggregation unit 64. The aggregation unit 64 manages whether or not there is a request for data transmission from the plurality of decompression control units 63, selects the decompression control units 63 regarding which there is a request, one at a time, and transmits the data to the data transmission unit 65. The plaintext data is stored in the transmission buffer 87 at the data transmission unit 65.

(6) The data transmission unit 65 issues an MWr_Cmd, and writes the plaintext data stored in the transmission buffer 87 to the main storage memory 24.

The above-described embodiment is an exemplification for description of the present invention, and is not intended to limit the scope of the present invention to the embodiment alone. One skilled in the art will be able to carry out the present invention in various other forms without departing from the scope of the present invention.

Also, the following items are included in the above-described embodiment. It should be noted, however, that items included in the present embodiment are not limited only to those described below.

Item 1

A compression/decompression apparatus that is configured to perform compression of plaintext data and decompression of compressed data includes: an error detection code generating unit configured to generate error detection code with respect to plaintext data; a compression circuit configured to compress plaintext data; a decompression circuit configured to decompress compressed data; and a comparing unit configured to generate error detection code with respect to plaintext data and compare this error detection code with other error detection code, wherein in a compression mode in which input plaintext data is taken as input, and the input plaintext data is to be compressed, the error detection code generating unit generates a first code that is an error detection code with respect to the input plaintext data, the compression circuit generates compressed data in which the input plaintext data is compressed, the decompression circuit generates restored plaintext data in which the compressed data is decompressed, the comparing unit generates a second code that is an error detection code with respect to the restored plaintext data and compares the second code with the first code, and in a case in which the first code and the second code agree, outputs the compressed data and the first code or the second code, and in a decompression mode in which input compressed data, and an input code that is an error detection code with respect to original plaintext data of the input compressed data, are taken as input, and the input compressed data is decompressed, the decompression circuit generates plaintext data in which the input compressed data is decompressed, the comparing unit generates a third code that is an error detection code with respect to the plaintext data and compares the third code with the input code, and in a case in which the input code and the third code agree, outputs the plaintext data.

Item 2

The compression/decompression apparatus according to item 1 further includes a plurality of compression/decompression control units, each configured including the error detection code generating unit, the compression circuit, the decompression circuit, and the comparing unit; a distribution unit configured to manage a state of the plurality of compression/decompression control units, and allocate a request for data compression that is input to one of the compression/decompression control units on the basis of the state; and an aggregation unit configured to perform arbitration of output of the plurality of compression/decompression control units, and to perform exclusive output thereof one at a time.

Item 3

The compression/decompression apparatus according to item 1 further includes a compression/decompression control unit configured including the error detection code generating unit, the compression circuit, the decompression circuit, and the comparing unit; a decompression control unit configured including the decompression circuit and the comparing unit, the decompression circuit being configured to generate plaintext data in which input compressed data that is compressed data that has been input is decompressed, and the comparing unit being configured to generate the third code that is an error detection code with respect to the plaintext data and compare the third code with an input code that is an error detection code that has been input, and to output the plaintext data in a case in which the input code and the third code agree; and a selecting unit configured to, upon receiving a request for data compression or data decompression, allocate the request to the compression/decompression control unit or the decompression control unit, wherein the selecting unit is configured to, upon receiving a request for data compression, allocate this request to the compression/decompression control unit, and upon receiving a request for data decompression, allocate this request to the decompression control unit in a case in which the decompression control unit is available for acceptance thereof, and allocate this request to the compression/decompression control unit in a case in which the decompression control unit is unavailable for acceptance thereof.

Item 4

In the compression/decompression apparatus according to item 3, the decompression circuit and the comparing unit in the decompression control unit are configured including a common circuit with the decompression circuit and the comparing unit in the compression/decompression control unit, respectively.

Item 5

In the compression/decompression apparatus according to item 4, the decompression control unit and the compression/decompression control unit are each composed of a programmable logic circuit part.

Item 6

A storage system includes: the compression/decompression apparatus according to item 1; a data storage apparatus; a main storage apparatus; and a processing apparatus, wherein upon receiving a write request for data, the processing apparatus records write target data in the write request in the main storage apparatus, and requests the compression/decompression apparatus to compress the write target data, the compression/decompression apparatus acquires the write target data from the main storage apparatus, and performs writeback of compressed data, in which the write target data is compressed, and an error detection code with respect to the write target data, to the main storage apparatus, and the processing apparatus stores the compressed data and the error detection code recorded in the main storage apparatus in the data storage apparatus, and upon receiving a read request for data, the processing apparatus reads compressed data of read target data in the read request and an error detection code from the data storage apparatus, and performs recording thereof in the main storage apparatus, and requests the compression/decompression apparatus to decompress the compressed data, the compression/decompression apparatus acquires the compressed data from the main storage apparatus and performs writeback of plaintext data, in which the compressed data is decompressed, to the main storage apparatus, and the processing apparatus outputs the plaintext data recorded in the main storage apparatus.

Item 7

A compression/decompression method for performing compression of plaintext data and decompression of compressed data, using a compression circuit that compresses plaintext data, and a decompression circuit that decompresses compressed data, includes: in a compression mode in which input plaintext data is taken as input, and the input plaintext data is to be compressed, generating a first code that is an error detection code with respect to the input plaintext data; causing the compression circuit to generate compressed data in which the input plaintext data is compressed; causing the decompression circuit to generate restored plaintext data in which the compressed data is decompressed; generating a second code that is an error detection code with respect to the restored plaintext data and comparing the second code with the first code; and in a case in which the first code and the second code agree, outputting the compressed data and the first code or the second code; and in a decompression mode in which input compressed data, and an input code that is an error detection code with respect to original plaintext data of the input compressed data, are taken as input, and the input compressed data is decompressed, causing the decompression circuit to generate plaintext data in which the input compressed data is decompressed; generating a third code that is an error detection code with respect to the plaintext data, and comparing the third code with the input code; and in a case in which the input code and the third code agree, outputting the plaintext data.

What is claimed is:

1. A compression/decompression apparatus configured to perform compression of plaintext data and decompression of compressed data, the compression/decompression apparatus comprising:
   an error detection code generating unit configured to generate error detection code with respect to plaintext data;
   a compression circuit configured to compress plaintext data;
   a decompression circuit configured to decompress compressed data; and
   a comparing unit configured to generate error detection code with respect to plaintext data and compare this error detection code with other error detection code, wherein
   in a compression mode in which input plaintext data is taken as input, and the input plaintext data is to be compressed,
   the error detection code generating unit generates a first code that is an error detection code with respect to the input plaintext data, the compression circuit generates compressed data in which the input plaintext data is compressed, the decompression circuit generates restored plaintext data in which the compressed data is decompressed, the comparing unit generates a second code that is an error detection code with respect to the restored plaintext data and compares the second code with the first code, and in a case in which the first code and the second code agree, outputs the compressed data and the first code or the second code, and
   in a decompression mode in which input compressed data, and an input code that is an error detection code with respect to original plaintext data of the input compressed data, are taken as input, and the input compressed data is decompressed,
   the decompression circuit generates plaintext data in which the input compressed data is decompressed, the comparing unit generates a third code that is an error detection code with respect to the plaintext data and compares the third code with the input code, and in a case in which the input code and the third code agree, outputs the plaintext data,
   wherein the compression/decompression apparatus further comprises:
   a compression/decompression control unit configured including the error detection code generating unit, the compression circuit, the decompression circuit, and the comparing unit;
   a decompression control unit configured including the decompression circuit and the comparing unit, the decompression circuit being configured to generate plaintext data in which input compressed data that is compressed data that has been input is decompressed, and the comparing unit being configured to generate the third code that is an error detection code with respect to the plaintext data and compare the third code with an input code that is an error detection code that has been input, and to output the plaintext data in a case in which the input code and the third code agree; and
   a selecting unit configured to, upon receiving a request for data compression or data decompression, allocate the request to the compression/decompression control unit or the decompression control unit, wherein
   the selecting unit is configured to,
   upon receiving a request for data compression, allocate this request to the compression/decompression control unit, and upon receiving a request for data decompression, allocate this request to the decompression control unit in a case in which the decompression control unit is available for acceptance thereof, and allocate this request to the compression/decompression control unit in a case in which the decompression control unit is unavailable for acceptance thereof.

2. The compression/decompression apparatus according to claim 1, wherein the decompression circuit and the comparing unit in the decompression control unit are configured including a common circuit with the decompression circuit and the comparing unit in the compression/decompression control unit, respectively.

3. The compression/decompression apparatus according to claim 2, wherein the decompression control unit and the compression/decompression control unit are each composed of a programmable logic circuit part.

4. A storage system, comprising:
the compression/decompression apparatus according to claim 1;
a data storage apparatus;
a main storage apparatus; and
a processing apparatus, wherein
upon receiving a write request for data,
the processing apparatus records write target data in the write request in the main storage apparatus, and requests the compression/decompression apparatus to compress the write target data,
the compression/decompression apparatus acquires the write target data from the main storage apparatus, and performs writeback of compressed data, in which the write target data is compressed, and an error detection code with respect to the write target data, to the main storage apparatus, and
the processing apparatus stores the compressed data and the error detection code recorded in the main storage apparatus in the data storage apparatus, and
upon receiving a read request for data,
the processing apparatus reads compressed data of read target data in the read request and an error detection code from the data storage apparatus, and performs recording thereof in the main storage apparatus, and requests the compression/decompression apparatus to decompress the compressed data,
the compression/decompression apparatus acquires the compressed data from the main storage apparatus and performs writeback of plaintext data, in which the compressed data is decompressed, to the main storage apparatus, and the processing apparatus outputs the plaintext data recorded in the main storage apparatus.

5. A compression/decompression apparatus configured to perform compression of plaintext data and decompression of compressed data, the compression/decompression apparatus comprising:

an error detection code generating unit configured to generate error detection code with respect to plaintext data;
a compression circuit configured to compress plaintext data;
a decompression circuit configured to decompress compressed data; and
a comparing unit configured to generate error detection code with respect to plaintext data and compare this error detection code with other error detection code, wherein
in a compression mode in which input plaintext data is taken as input, and the input plaintext data is to be compressed,
the error detection code generating unit generates a first code that is an error detection code with respect to the input plaintext data, the compression circuit generates compressed data in which the input plaintext data is compressed, the decompression circuit generates restored plaintext data in which the compressed data is decompressed, the comparing unit generates a second code that is an error detection code with respect to the restored plaintext data and compares the second code with the first code, and in a case in which the first code and the second code agree, outputs the compressed data and the first code or the second code, and
in a decompression mode in which input compressed data, and an input code that is an error detection code with respect to original plaintext data of the input compressed data, are taken as input, and the input compressed data is decompressed,
the decompression circuit generates plaintext data in which the input compressed data is decompressed, the comparing unit generates a third code that is an error detection code with respect to the plaintext data and compares the third code with the input code, and in a case in which the input code and the third code agree, outputs the plaintext data,
wherein the compression/decompression apparatus further comprises:
a plurality of compression/decompression control units, each configured including the error detection code generating unit, the compression circuit, the decompression circuit, and the comparing unit;
a distribution unit configured to manage a state of the plurality of compression/decompression control units, and allocate a request for data compression that is input to one of the compression/decompression control units on the basis of the state; and
an aggregation unit configured to perform arbitration of output of the plurality of compression/decompression control units, and to perform exclusive output thereof one at a time.

* * * * *